(12) United States Patent
Tsukuda

(10) Patent No.: US 6,333,780 B1
(45) Date of Patent: Dec. 25, 2001

(54) PROJECTION ALIGNER

(75) Inventor: Eiji Tsukuda, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/598,331

(22) Filed: Jun. 21, 2000

(30) Foreign Application Priority Data

Dec. 27, 1999 (JP) .............................................. P11-369954

(51) Int. Cl.[7] .......................... G03B 27/74; G03B 27/72; G03B 27/52; G03C 5/00; G02F 1/1335
(52) U.S. Cl. .................................. 355/68; 355/35; 355/53; 355/55; 355/67; 430/269; 349/4; 349/74; 349/82
(58) Field of Search .................................. 355/35, 53, 55, 355/67; 430/269; 349/4, 74, 82

(56) References Cited

U.S. PATENT DOCUMENTS

| | | | |
|---|---|---|---|
| 5,045,419 | * 9/1991 | Okumura | 430/20 |
| 5,109,290 | 4/1992 | Imai . | |
| 5,742,362 | * 4/1998 | Chikamichi | 430/269 |
| 5,861,929 | * 1/1999 | Spitzer | 349/74 |
| 5,917,464 | 6/1999 | Stearns . | |
| 6,097,361 | * 8/2000 | Rohner | 345/87 |

FOREIGN PATENT DOCUMENTS 7-029788    1/1995   (JP) .

* cited by examiner

Primary Examiner—Alan A. Mathews
Assistant Examiner—Khaled Brown
(74) Attorney, Agent, or Firm—Oblon, Spivak, McClelland, Maier & Neustadt, P.C.

(57) ABSTRACT

The pattern of a spatial frequency filter including a liquid crystal element ($103_1$–$103_n$) is controlled without removing the filter from a projection lens system. Specifically, a spatial frequency filter (103) is disposed at the pupil surface in a projection lens system (10). A means for controlling the spatial frequency filter (103) includes a liquid crystal element controller (15b) and a filter information storage (16b). A pattern required for the spatial frequency filter (103) is transferred from the filter information storage (16b) to the liquid crystal controller (15b). The transmittance and phase shift of the spatial frequency filter (103) are previously designed by simulation, for example. Based on these data, an aspect of applying a voltage to the liquid crystal element ($103_1$–$103_n$) is stored in the filter information storage (16b).

14 Claims, 10 Drawing Sheets

F I G . 7
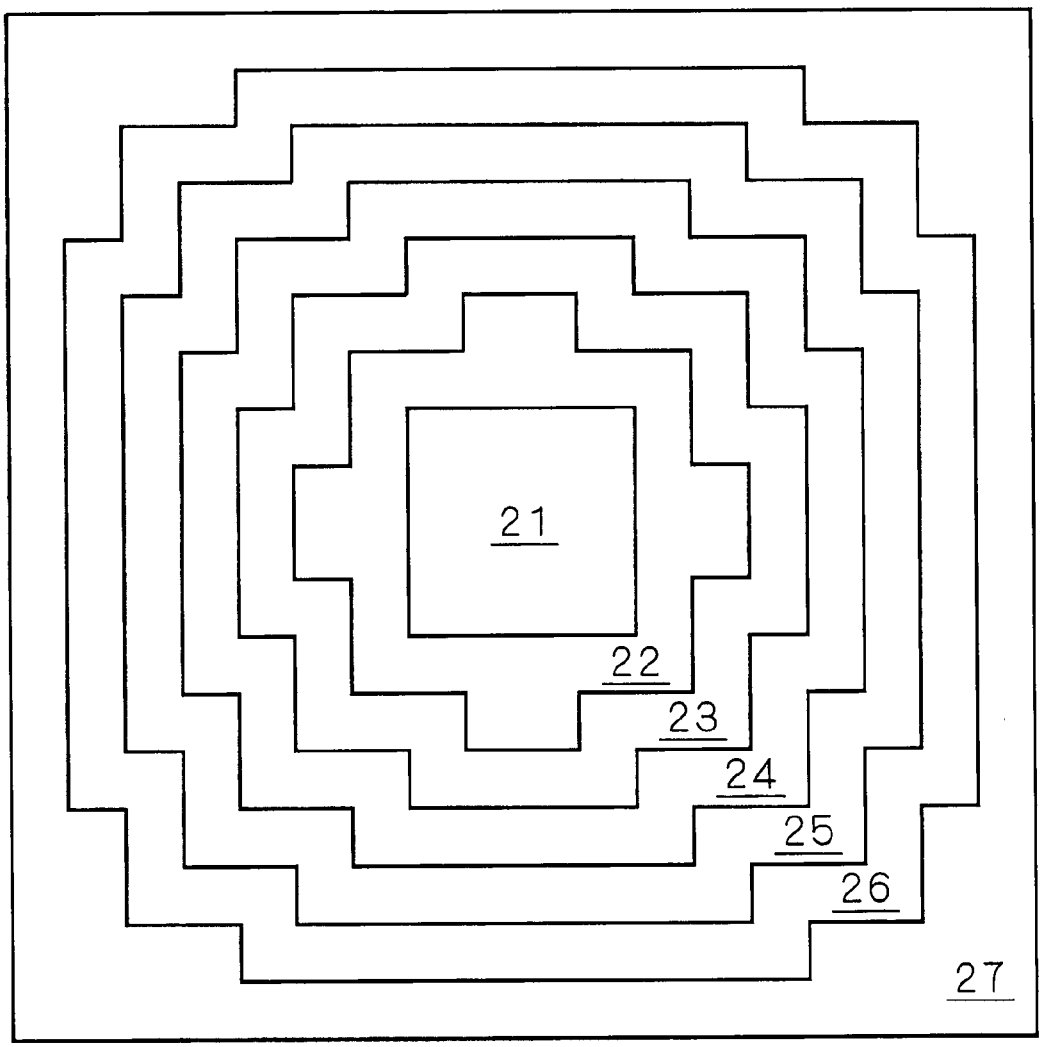

<PRIOR ART>

<PRIOR ART>

PROJECTION ALIGNER

BACKGROUND OF THE INVENTION

1. Field of the Invention

The present invention relates to projection aligners in photolithography processes for use in the manufacture of semiconductor devices.

2. Description of the Background Art

Photolithography processes are adopted for various steps of the manufacture of semiconductor devices. In the photolithography processes, a projection aligner is employed for defining various patterns on a semiconductor wafer.

In the projection aligner, the intensity of the light applied to a photoresist disposed above the semiconductor wafer is controlled by a photomask (reticle).

FIG. 12 is a plan view of a conventional photomask 9. FIG. 13 is a cross section schematically illustrating the structure taken along the line B1—B1 in FIG. 12. The photomask 9 comprises a body 92 composed of quartz, and shields 93 selectively provided on the body 92. The shields 93 are formed from chromium (Cr), for example, and they considerably reduce the light transmittance with respect to the position where only the body 92 exists.

In order to raise resolution limit due to miniaturization, there have been proposed phase shift masks such as Levenson type photomasks. FIG. 14 is a plan view of a conventional Levenson type photomask 90. FIG. 15 is a cross section schematically illustrating the structure taken along the line B2—B2 in FIG. 14. The photomask 90 has three regions 90a, 90b and 90c. The phase of the light passing through the region 90c is shifted π with respect to the phase of the light passing through the region 90b. The region 90a reduces significantly the light transmittance with respect to the regions 90b and 90c.

The photomask 90 comprises a body 92, shields 93 selectively provided on the body 92, and phase shifters 94. The shields 93 open at the position corresponding to the region 90a or 90b, and the phase shifters 94 cover the opening of the shields 93 at the position corresponding to the region 90c. The photomask 90 can control both the intensity and phase of the light passing therethrough, thereby to optimize resolution and depth of focus.

Besides the stated technique, light source of shorter wavelength, modified illumination obtained by control of an aperture, and pupil filter method have been proposed, in order to raise resolution limit due to miniaturization. The pupil filter method comprises disposing a patterned spatial frequency filter at the pupil surface in a projection lens system. The spatial frequency filter can also control both the intensity and phase of the light passing therethrough, thereby to optimize resolution and depth of focus. It is however noted that the light passing through the projection lens system varies according to the pattern of the photomask 90. It is therefore preferable to optimize the pattern of a spatial frequency filter for every photomasks.

The photomask 90, however, calls for patterns which are independent one another in their respective steps of the manufacture of semiconductor devices, and there are also needed various mask making processes such as electron beam cutting, separating from wafer processes. Further, since the phase shift mask calls for the phase shifter 94 in addition to the body 92 and shields 93, its design, making control and defect inspection are complicated. This causes an increase in the photomask revision. Consequently, the conventional photomasks have required a considerable amount of time for their making.

The projection lens system is the essential part in order that a photomask pattern is faithfully reproduced on a wafer, and it is necessary to maintain a high precision. The projection lens system is therefore placed in a closed case, in order to assure the rigid control of temperature, humidity and pressure. Since the spatial frequency filter is a component of the projection lens system, this cannot be replaced easily as is the case with aperture. It is therefore difficult to control the pattern of a spatial frequency filter for every photomasks.

SUMMARY OF THE INVENTION

According to a first aspect of the invention, a projection aligner comprises: a spatial frequency filter having at least one liquid crystal element, provided in a projection lens system projecting light passed through a photomask onto an object to be processed; and a liquid crystal controller that controls at least one of transmittance and refractive index of the liquid crystal element.

In the first aspect, the transmittance and refractive index of a liquid crystal element are controlled by the liquid crystal controller. Thereby, the phase shift and transmittance required for the spatial frequency filter can be controlled without removing the filter from the projection lens system. This enables to obtain a spatial frequency filter in which a suitable function of pupil is employed for various photomask patterns.

Preferably, the projection aligner further comprises an aperture that introduces the light into the photomask and has at least one liquid crystal element.

According to a second aspect, the projection aligner of the first aspect is characterized in that the spatial frequency filter has a plurality of liquid crystal elements.

In the second aspect, even when it is difficult to control independently refractive index and transmittance by using a single liquid crystal element, a spatial frequency filter which has a pattern of desired phase shift and transmittance as a whole, can be obtained by stacking a plurality of liquid crystal elements.

Preferably, the projection aligner of the second aspect is characterized in that the liquid crystal element controller controls the transmittance and the refractive index of the liquid crystal elements independently.

Preferably, the projection aligner of first aspect further comprises a filter information storage storing the transmittance and phase shift of the spatial frequency filter.

More preferably, the projection aligner of the first aspect is characterized in that the phase shift of the spatial frequency filter is obtained by controlling an optical path difference according to the refractive index of the liquid crystal element.

According to a third aspect, a projection aligner comprises: a photomask having at least one liquid crystal element; and a liquid crystal element controller for controlling the transmittance of the liquid crystal element.

In the third aspect, it is possible to reduce significantly the number of mask making processes to be needed per photomask pattern. In addition, there is no need to replace the mask for each step in the photolithography process, thereby to make a pattern correction promptly.

Preferably, the projection aligner of the third aspect further comprises an aperture that introduces the light into the photomask and has at least one liquid crystal element.

According to a fourth aspect, the projection aligner of the third aspect is characterized in that the photomask has a plurality of liquid crystal elements.

In the fourth aspect, even when it is difficult to independently control refractive index and transmittance by using a single liquid crystal element, a photomask, e.g., a phase shift mask, which has a pattern of desired phase shift and transmittance as a whole, can be obtained by stacking a plurality of liquid crystal elements.

Preferably, the projection aligner of the fourth aspect is characterized in that the liquid crystal element controller controls the transmittance of the liquid crystal elements independently.

More preferably, the projection aligner of the fourth aspect is characterized in that the liquid crystal element controller controls the refractive index of the liquid crystal elements independently.

According to a fifth aspect, the projection aligner of the fourth aspect further comprises a projection lens system performing a reduction projection of the photomask onto the object to be processed.

In the fifth aspect, it is possible to relax the degree of miniaturization demanded in a liquid crystal when it is used as a photomask.

Preferably, the projection aligner of the third aspect further comprises a filter information storage storing the pattern and refractive index of the photomask.

More preferably, the projection aligner of the third aspect is characterized in that the photomask is a phase shift mask.

Accordingly, in view of the foregoing, it is an object of the present invention to reduce substantially the number of mask making processes.

It is another object of the invention to realize that the pattern of a spatial frequency filter is controlled without taking the spatial frequency filter out of a projection lens system.

These and other objects, features, aspects and advantages of the present invention will become more apparent from the following detailed description of the present invention when taken in conjunction with the accompanying drawings.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIGS. 7 and 8 are plan views illustrating a driven state of a liquid crystal;

DESCRIPTION OF THE PREFERRED EMBODIMENTS

Figure 1:
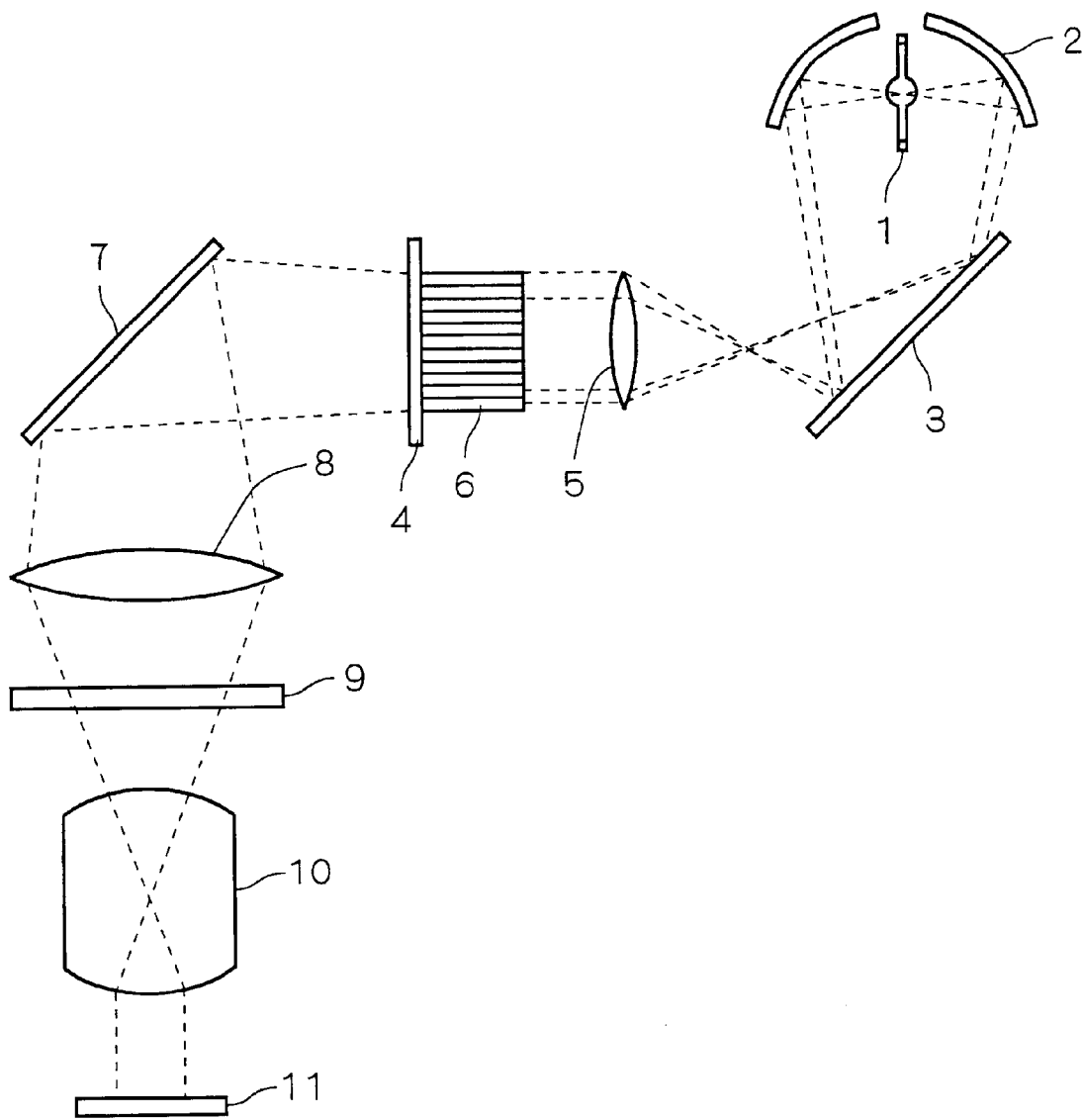
FIG. 1 is a conceptual diagram illustrating the whole of a projection aligner to which the present invention is applied.

Referring now to the drawings, wherein like reference numerals designate identical or corresponding parts throughout the several views, and more particularly to FIGS. 1–11 thereof, there are illustrated exemplary embodiments of the present invention.

FIG. 1 is a conceptual diagram illustrating the whole of a projection aligner to which the invention is applied. Light emitted from a light emitting lamp 1 is reflected from a reflecting mirror 2 which is curved in oval shape, for example, and the light is then reflected from a plane reflecting mirror 3 into an input lens 5. The light from the input lens 5 passes through a fly eye lens 6 and an aperture 4 in the order named, to a plane reflecting mirror 7. The light reflected from the plane reflecting mirror 7 passes through a condenser lens 8 onto a photomask 9. The light transmitted through the photomask 9 passes through a projection lens system 10 onto an object to be processed, e.g., a wafer 11.

Figure 2:
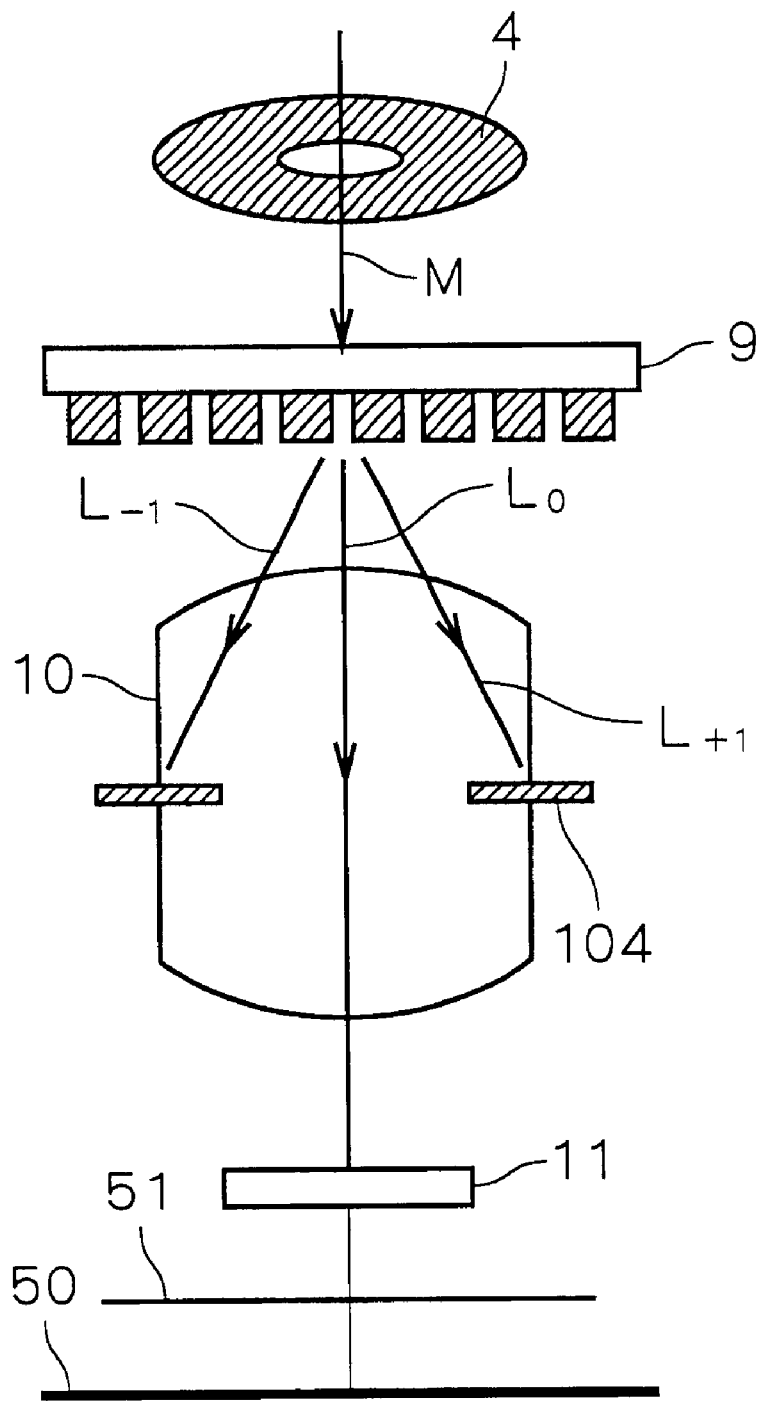
FIGS. 2 and 3 are conceptual diagrams illustrating operation of a projection aligner to which the present invention is applied.
Figure 3:
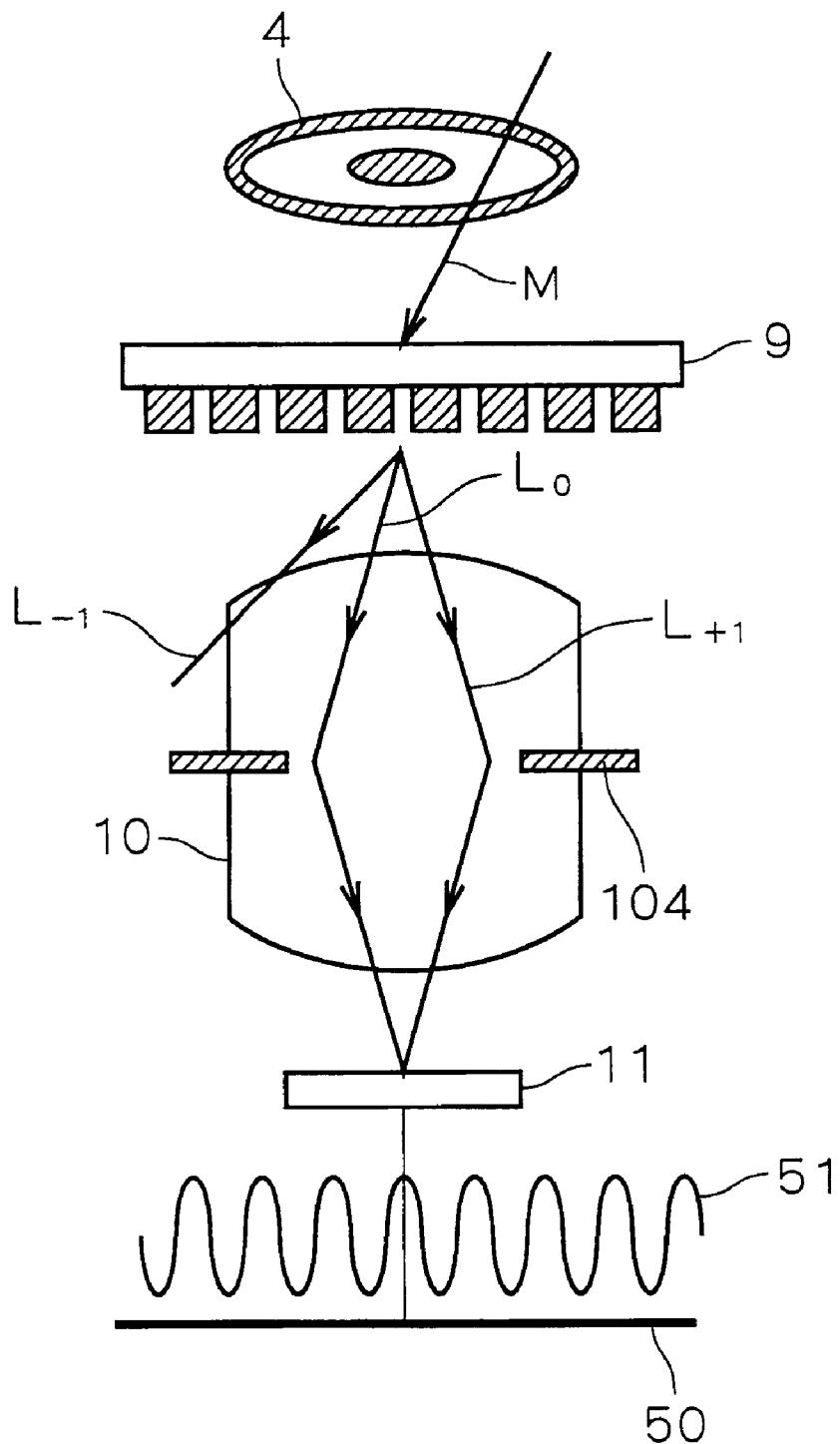

FIGS. 2 and 3 are conceptual diagrams, with a plane reflecting mirror 7 and condenser lens 8 omitted, illustrating an aspect that the light from an aperture 4 reaches a wafer 11. In these figures, light M passing through the aperture 4 for illumination enters a photomask 9, and the light M is then diffracted by the pattern of the photomask 9.

Referring to FIGS. 2 and 3, the stop of the aperture 4 is set so as to obtain a normal illumination and ring band illumination. There are shown −1 order diffraction light $L_{-1}$, 0 order diffraction light $L_0$, and +1 order diffraction light $L_{+1}$, and these diffraction lights pass through a projection lens system 10 onto the wafer 11. Graph 51 shows the intensity of the light irradiated to the wafer 11, on the basis of the position of a base line 50 as zero, but showing in an enlarged scale, centered on the position of a virtual line from an object to be processed 11 to the base line 50.

In FIG. 2, the −1 order diffraction light $L_{-1}$ and the +1 order diffraction light $L_{+1}$ are shielded by a shield 104 at the pupil surface in the projection lens system 10. Therefore, a light intensity that is almost uniformly distributed by the 0 order diffraction light $L_0$, is obtained on the object to be processed 11. Whereas in FIG. 3, due to a modified illumination, light M enters obliquely with respect to the photomask 9, and the −1 order diffraction light $L_{-1}$, the 0 order diffraction light $L_0$, and the +1 order diffraction light $L_{+1}$ incline outwardly from the projection lens system 10, as compared with that shown in FIG. 2. As a result, the −1 order diffraction light $L_{-1}$ is shielded by the shield 104, failing to be irradiated to the object to be processed 11, while the 0 order diffraction light $L_0$ and the +1 order diffraction light $L_{+1}$, each passing through the projection lens system 10, form an interference fringe on the object to be processed 11, as shown in the graph 51.

Figure 4:
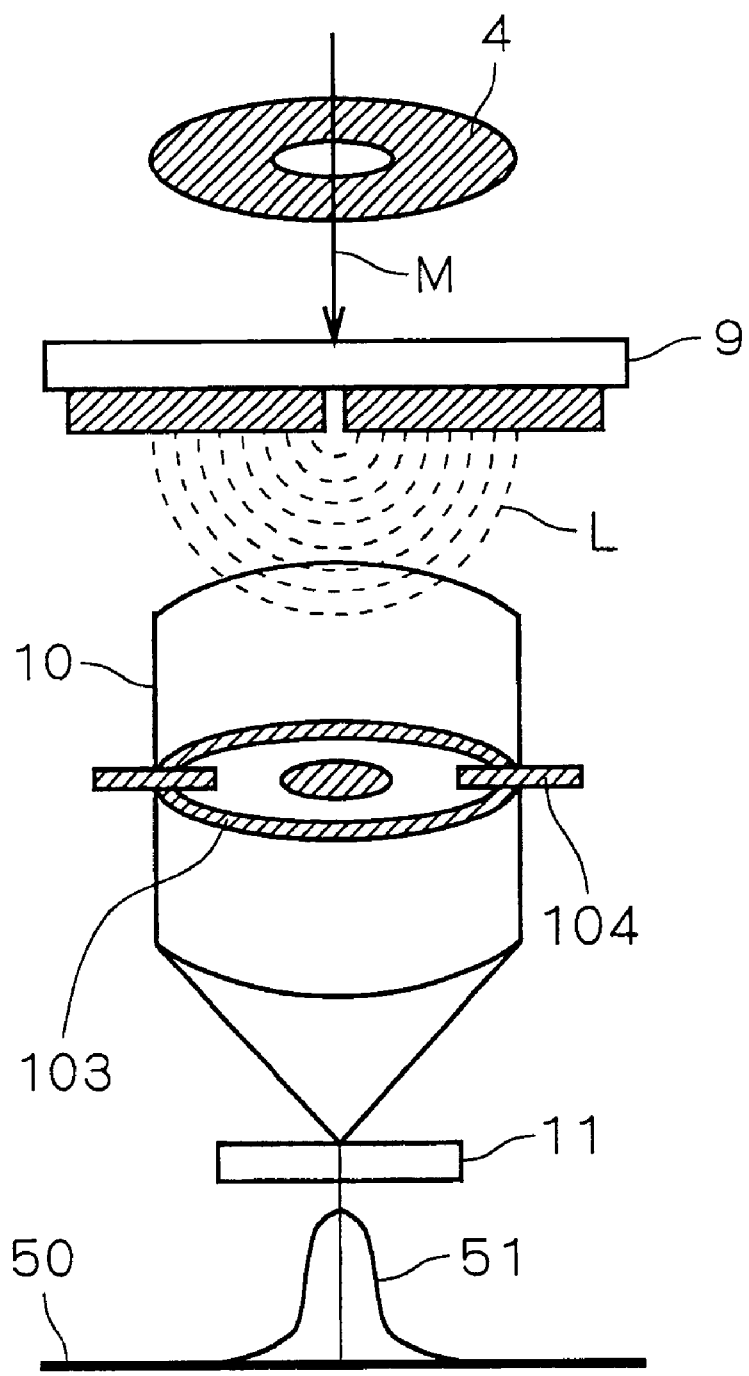
FIG. 4 is a conceptual diagram of a pupil filter method.

It is however possible to adopt the pupil filter method by adding, to the pupil surface in the projection lens system 10, not only the shield 104 that simply shields the vicinity of the periphery in the projection lens system 10, but also the spatial frequency filter 103. FIG. 4 illustrates conceptually the pupil filter method, in which the spatial frequency filter 103 is also provided at the pupil surface of the projection lens system 10. Specifically, FIG. 4 shows a case that a ring band pattern is formed on the spatial frequency filter 103.

Referring to FIG. 4, a photomask 9 has a single opening, and the stop of an aperture 4 is set for normal illumination. Diffraction light L is passed through the opening of the photomask 9 and is irradiated to a projection lens system 10 in the form of a point light source, but it is focused by the projection lens system 10 including shields 104 and the spatial frequency filter 103. Thereby, an intensity distribution having a single peak is formed on an object to be processed 11, as shown in graph 51 which is enlarged like FIGS. 2 and 3.

First Preferred Embodiment

Figure 5:
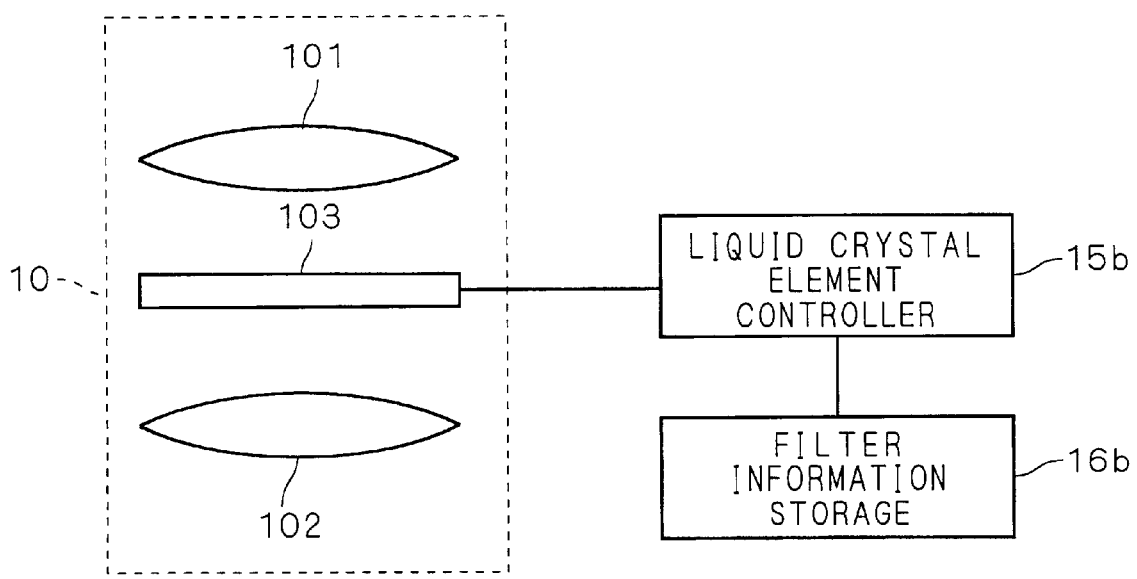
FIGS. 5 and 6 are conceptual diagrams illustrating a construction according to a first preferred embodiment of the invention.

FIG. 5 is a conceptual diagram illustrating a construction of a projection lens system 10 to which a spatial frequency filter 103 of a first preferred embodiment is applied. In the projection lens system 10, the spatial frequency filter 103 is disposed between a photomask side lens 101 disposed close to a photomask 9, and an object processed side lens 102 disposed close to an object to be processed 11. But it is preferably disposed at the pupil surface.

Figure 6:
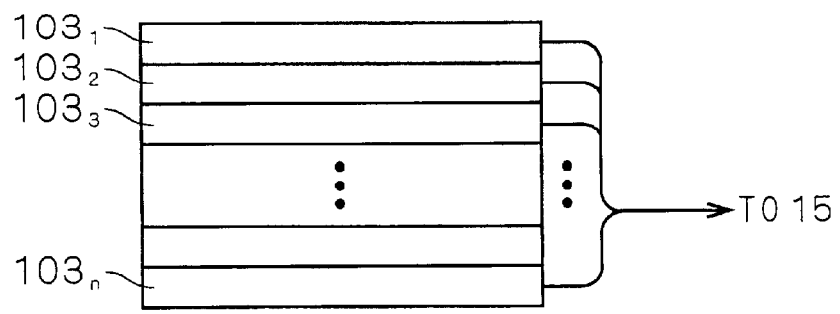

FIG. 6 is a conceptual diagram illustrating a construction of a spatial frequency filter 103 according to the first preferred embodiment. The spatial frequency filter 103 comprises at least one liquid crystal element. FIG. 6 shows an aspect that a plurality of liquid crystal elements $103_1$, $103_2$, $103_3$, ... $103_n$ are stacked to form a spatial frequency filter 103. This spatial frequency filter 103 can be employed as the spatial frequency filter 103 shown in FIG. 4.

A means for controlling the spatial frequency filter 103 includes a liquid crystal element controller 15b and a filter information storage 16b. A pattern required for the spatial frequency filter 103 is transferred from the filter information storage 16b to the liquid crystal element controller 15b. The transmittance and phase shift of the spatial frequency filter 103 are previously designed by simulation, for example. Based on these data, an aspect of applying a voltage to the liquid crystal element is stored in the filer information storage 16b. Upon receipt of these data, the liquid crystal element controller 15b controls the transmittance and refractive index of the liquid crystal elements $103_1$, $103_2$, $103_3$, ... $103_n$, respectively.

The phase shift and transmittance required for the spatial frequency filter 103 are generally complicated, however, the setting of the phase shift is effected by controlling an optical path difference depending on the refractive index.

Figure 8:
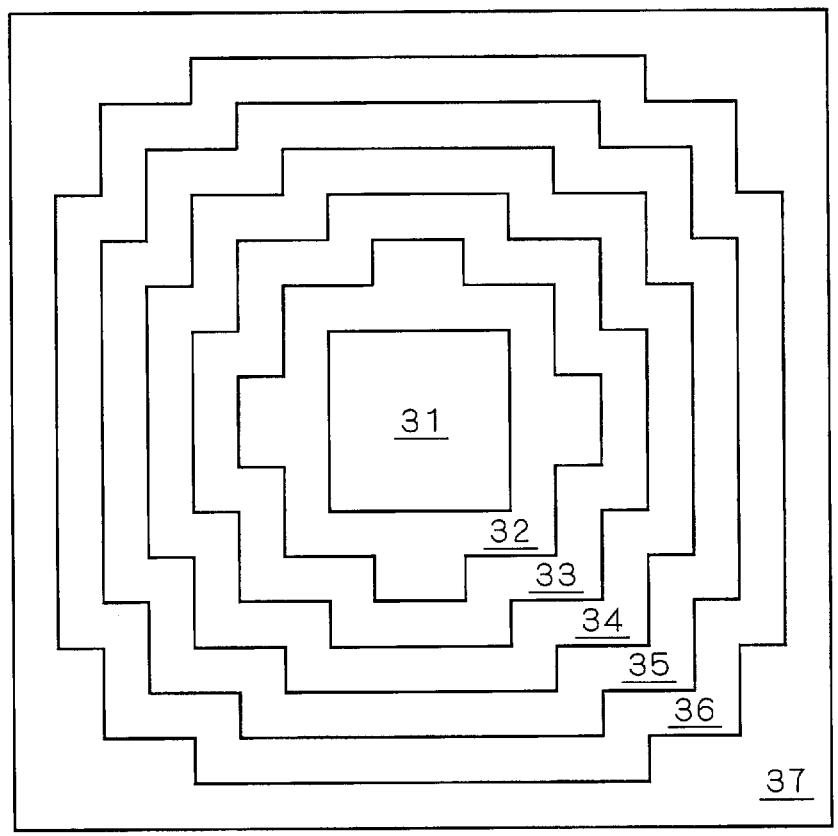

For simplicity, consider now a case that the spatial frequency filter 103 is formed by two layers of the liquid crystal elements $103_1$, and $103_2$. FIGS. 7 and 8 are plan views illustrating a driven state of the liquid crystal elements $103_1$ and $103_2$, respectively. Specifically, the liquid crystal element $103_1$, comprising a plurality of regions 21, 22, 23, 24, 25, 26 and 27, which extend coaxially from the center of the liquid crystal element $103_1$, and have different driven states, is in such a driven state that the transmittances of these regions 21 to 27 are increased in the order named. The liquid crystal element $103_2$ has a plurality of regions 31, 32, 33, 34, 35, 36 and 37, which have the same shape as the regions 21, 22, 23, 24, 25, 26 and 27 of the liquid crystal element $103_1$, respectively. The regions 31, 33, 35 and 37 are driven so that these regions have the same transmittance as the regions 21, 23, 25 and 27, respectively. On the other hand, the regions 32, 34 and 36 are driven so that these regions have the maximum transmittance to be attained by the liquid crystal element $103_2$.

The light passing through the spatial frequency filter 103 is transmitted through a plurality of paired regions 21 and 31, regions 22 and 32, regions 23 and 33, regions 24 and 34, regions 25 and 35, regions 26 and 36, and regions 27 and 37. That is, the liquid crystal element $103_1$ functions mainly to control transmittance, and the liquid crystal element $103_2$ functions mainly to control optical path difference, namely phase shift. Thus, both cooperate in forming a ring band filter pattern.

With a single liquid crystal element, it is difficult to independently control refractive index and transmittance. However, by stacking a plurality of liquid crystal elements as stated earlier, it is possible to form a spatial frequency filter 103 which has a pattern of desired phase shift and transmittance as a whole. Of course, if a pattern required for the spatial frequency filter 103 is realized, the filter 103 may be formed by a single liquid crystal element.

Therefore, without removing the spatial frequency filter 103 from the projection lens system 10, resolution and depth of focus can be optimized by the spatial frequency filter 103 formed by a liquid crystal element, preferably by stacking a plurality of liquid crystal elements, where these liquid crystal elements are controlled by the liquid crystal element controller 15b.

In addition, the projection lens system 10 can be formed by employing a function of pupil suitable for each photomask pattern, by a simple means that a pattern required for the spatial frequency filter 103 is stored in the filter information storage 16b, and the pattern is corrected by altering the storage data. Thereby, corrections for photomask patterns can be made promptly. This leads to an extremely short TAT (turn around time, i.e., the necessary time per manufacturing step), thus lowering the cost of semiconductor devices manufactured.

Second Preferred Embodiment

Figure 9:
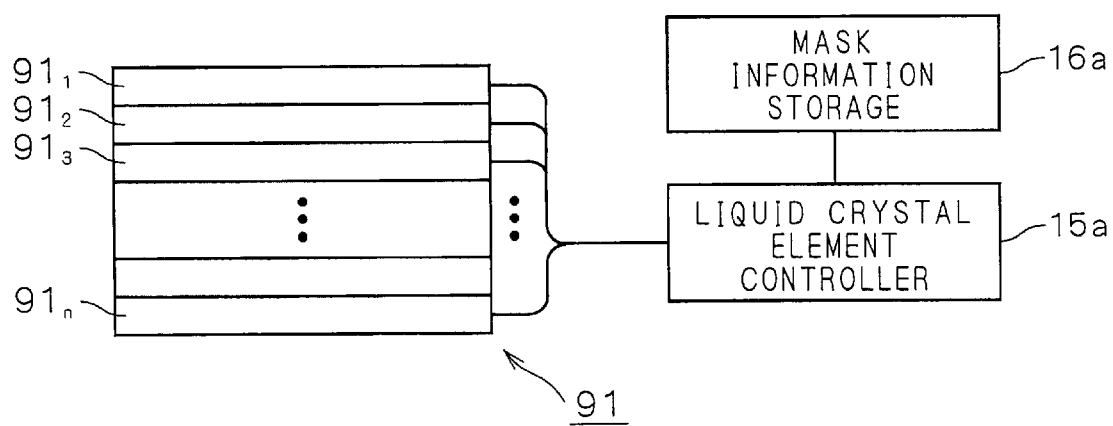
FIG. 9 is a conceptual diagram illustrating the construction according to a second preferred embodiment of the invention.

FIG. 9 is a conceptual diagram illustrating a construction of a photomask 91 according to a second preferred embodiment of the invention, as well as a means for controlling the photomask 91. The photomask 91 comprises at least one liquid crystal element. FIG. 9 shows an aspect that a plurality of liquid crystal elements $91_1$, $91_2$, $91_3$, ... $91_n$ are stacked to form a photomask 91. The photomask 91 can be employed as the photomask 9 shown in FIG. 1.

A means for controlling the photomask 91 includes a liquid crystal element controller 15a and a mask information storage 16a. A pattern required for the photomask 91 is transferred from the photomask information storage 16a to the liquid crystal element controller 15a. The pattern and refractive index of the photomask 91 are previously designed by simulation, for example. Based on these data, an aspect of applying a voltage to the liquid crystal elements is stored in the photomask information storage 16a. Upon receipt of these data, the liquid crystal element controller 15a controls independently the liquid crystal elements $91_1$, $91_2$, $91_3$, ... $91_n$.

Figure 10:
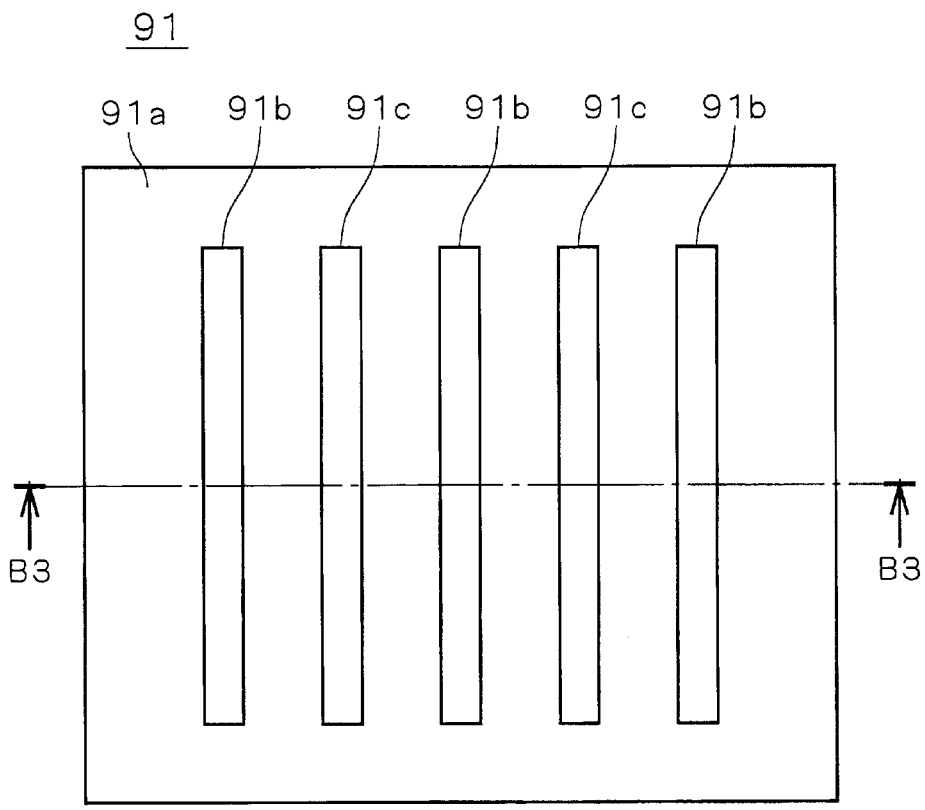
FIG. 10 is a plan view illustrating the construction of the second preferred embodiment.
Figure 14:
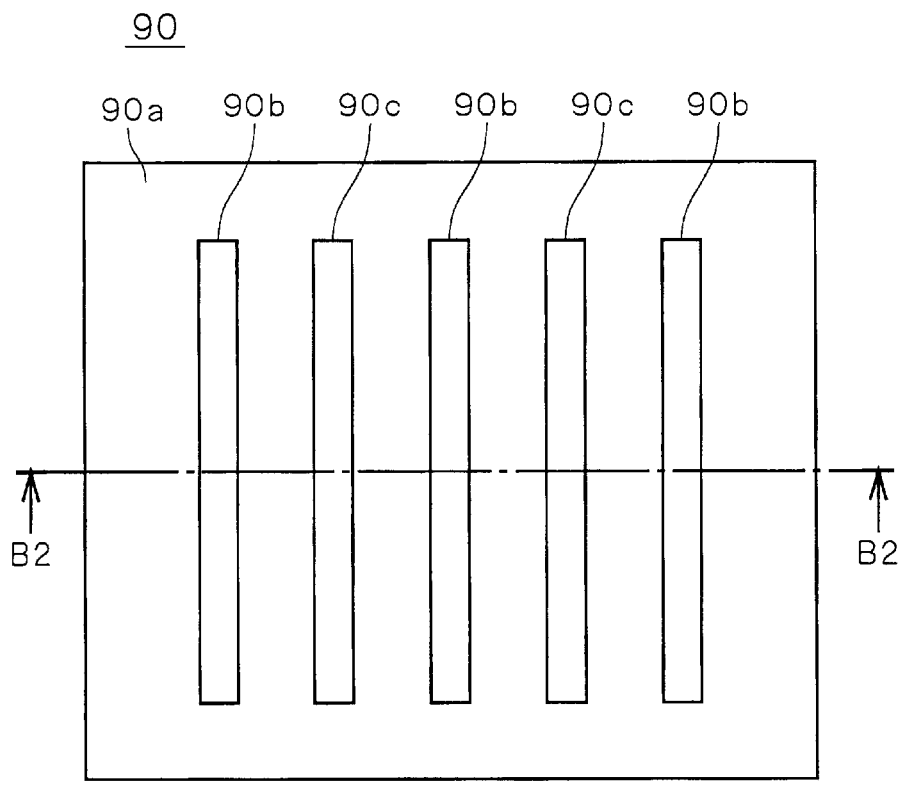
FIG. 14 is a plan view of a conventional technique.
Figure 15:
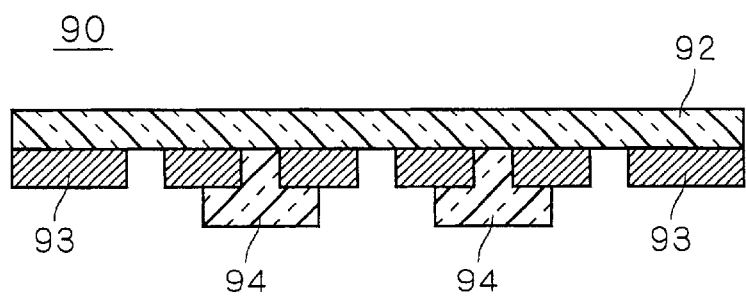
FIG. 15 is a cross section of the conventional technique in FIG. 14.

FIG. 10 is a plan view of the structure of a photomask 91. Like the photomask 90 (FIG. 14), the photomask 91 has three regions 91a, 91b and 91c.

Figure 11:
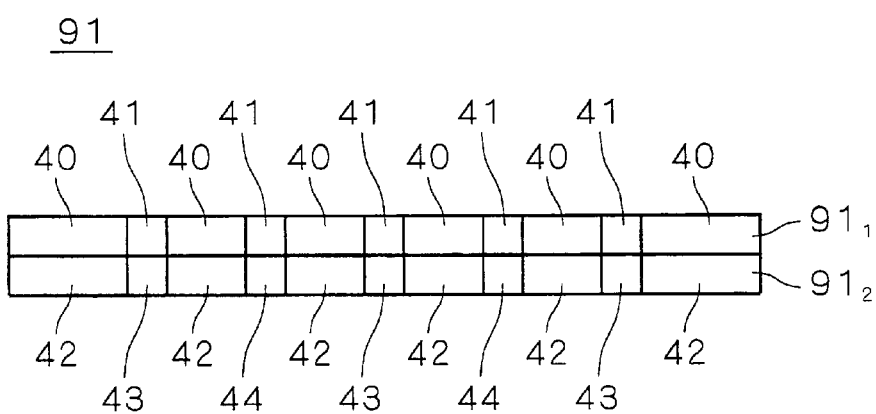
FIG. 11 is a cross section illustrating the construction of the second preferred embodiment.
Figure 12:
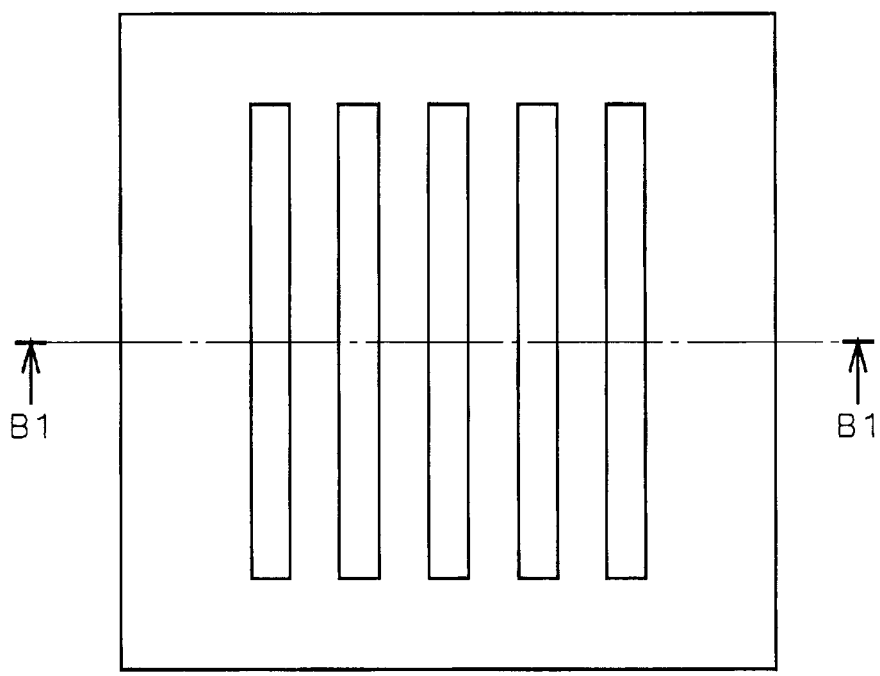
FIG. 12 is a plan view of a conventional technique.

FIG. 11 is a cross section illustrating the sectional structure of the photomask 91 when it is formed by stacking two liquid crystal elements $91_1$, and $91_2$. This corresponds to the section taken along the line B3—B3 in FIG. 10.

The liquid crystal controller 15a controls a liquid crystal element $91_1$, so as to set two regions 40 and 41 of different light transmission characteristics. Similarly, the liquid crystal controller 15a controls a liquid crystal element $91_2$ so as to set three regions 42, 43 and 44 of different light transmission characteristics.

When viewed from above, the regions 40 and 42 overlap at the position of region 91a, the regions 41 and 43 overlap at the position of region 91b, and the regions 41 and 44 overlap at the position of region 91c, respectively.

The two liquid crystal elements $91_1$ and $91_2$ are controlled independently by the liquid crystal element controller 15a. Therefore, by using the liquid crystal elements $91_1$ and $91_2$ of different characteristics, it is possible to set such that the phase of light passing through the region 91c is shifted $\pi$ with respect to the phase of the light passing through the region 91b, and, the region 91a reduces significantly the light transmittance with respect to the regions 91b and 91c. That is, the regions 41 and 44, and regions 41 and 43, can be set in paired cooperation relationship so that the beams of light passing through their respective regions are shifted by $\pi$ each other. Also, the regions 40 and 42 can be set in paired cooperation relationship so as to reduce significantly the light transmittance with respect to other regions.

Figure 13:
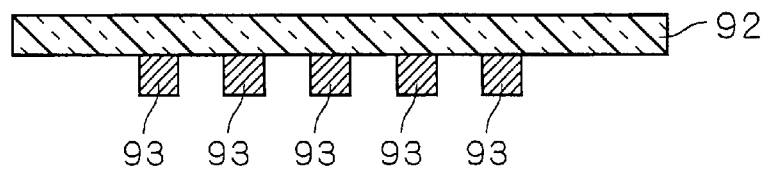
FIG. 13 is a cross section of the conventional technique in FIG. 12.

It is, of course, possible to form the photomask 91 by using a single liquid crystal element. However, it is preferable to use a plurality of liquid crystal elements which differ in characteristics such as the relationship between refractive index and transmittance. In this case, the degree of freedom of control becomes high, which is especially useful in obtaining a phase shift mask. It should be noted that, as the mask 9 shown in FIG. 13, the function of making decision whether to allow for the passage of light, can be effected even when the photomask 91 is formed by a single liquid crystal element.

Thus, with the construction that the photomask 91 is formed by a liquid crystal element, preferably by stacking a plurality of liquid crystal elements, and these liquid crystal elements are controlled by the liquid crystal element controller 15a, it is possible to reduce considerably the number of mask making processes required per photomask pattern, by the following means that a pattern required for the photomask 91 is stored in the mask information storage 16a, and the pattern is corrected by altering the storage data. In addition, there is no need to replace the mask per step in the photolithography process, and a pattern correction can be made promptly. This leads to an extremely short TAT, thus lowering the cost of semiconductor devices manufactured.

In order to define a pattern on a wafer 11, a complicated and fine pattern is demanded in the photomask 91. However, the degree of miniaturization demanded in the pattern of the liquid crystal element provided for the photomask 91 can be relaxed when the projection lens system 10 performs a reduction projection having a large reduction ratio.

Modifications

Although in the foregoing embodiments a liquid crystal element is adopted for a photomask or spatial frequency filter, it is, of course, possible to adopt a liquid crystal element for both.

Further, a liquid crystal element may be adopted for an aperture 4, so that the opening shape of the aperture 4 is determined by controlling the transmittance of the liquid crystal element. This type of aperture is proposed in, for example, Japanese Patent Application Laid-Open No. 7-29788 (1995). Therefore, the technique of the present invention may be combined with the technique of this publication.

While the invention has been shown and described in detail, the foregoing description is in all aspects illustrative and not restrictive. It is therefore understood that numerous modifications and variations can be devised without departing from the scope of the invention.

What is claimed is:

1. A projection aligner, comprising:
    a projection lens system through which light passing through a photomask passes on a way to an object to be processed, said projection lens system, including,
    a lens, and
    a spatial frequency filter having at least one liquid crystal element and projecting light passed through said photomask onto said object to be processed; and
    a liquid crystal controller that controls at least one of transmittance and refractive index of said liquid crystal element,
    wherein said spatial frequency filter is provided in a position closer to said object to be processed than said lens.

2. The projection aligner according to claim 1, further comprising an aperture that introduces said light into said photomask and has at least one liquid crystal element.

3. The projection aligner according to claim 1, wherein said spatial frequency filter has a plurality of liquid crystal elements.

4. The projection aligner according to claim 3, wherein said liquid crystal element controller controls said at least one of said transmittance and said refractive index of said liquid crystal elements independently.

5. The projection aligner according to claim 1, further comprising a filter information storage storing said at least one of said transmittance and phase shift of said spatial frequency filter.

6. The projection aligner according to claim 5, wherein said phase shift of said spatial frequency filter is obtained by controlling an optical path difference according to said refractive index of said liquid crystal element.

7. A projection aligner comprising:
    a photomask having at least one liquid crystal element; and
    a liquid crystal element controller for controlling the transmittance and refractive index of said liquid crystal element.

8. The projection aligner according to claim 7, further comprising an aperture that introduces said light into said photomask and has at least one liquid crystal element.

9. The projection aligner according to claim 7, wherein said liquid crystal element controller controls said transmittance of said liquid crystal elements independently.

10. The projection aligner according to claim 9, wherein said liquid crystal element controller controls said refractive index of said liquid crystal elements independently.

11. The projection aligner according to claim 7, further comprising a projection lens system performing a reduction projection of said photomask onto said object to be processed.

12. The projection aligner according to claim 7, further comprising a filter information storage storing at least one of pattern and refractive index of said photomask.

13. The projection aligner according to claim 12, wherein said photomask is a phase shift mask.

14. A projection aligner, comprising:
    a photomask having at least a first liquid crystal element;
    a liquid crystal element controller for controlling the transmittance of said first liquid crystal element in a direction of light passing through said photomask; and
    a spatial frequency filter having at least a second liquid crystal element and configured to project light passed through said photomask onto an object to be processed.

* * * * *